(12) United States Patent
Montminy et al.

(10) Patent No.: US 7,906,984 B1
(45) Date of Patent: Mar. 15, 2011

(54) RELOCATABLE FIELD PROGRAMMABLE GATE ARRAY BITSTREAMS FOR FAULT TOLERANCE

(75) Inventors: David P. Montminy, Albuquerque, NM (US); Rusty O. Baldwin, Huber Heights, OH (US); Paul D. Williams, Prattville, AL (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 73 days.

(21) Appl. No.: 12/393,288

(22) Filed: Feb. 26, 2009

Related U.S. Application Data

(60) Provisional application No. 61/067,151, filed on Feb. 26, 2008.

(51) Int. Cl.
*H03K 19/003* (2006.01)

(52) U.S. Cl. .................. 326/10; 326/9; 326/38; 326/41; 714/100; 714/710

(58) Field of Classification Search .............. 326/37–47, 326/9–10; 714/13, 7, 5, 724, 725, 30–31, 714/42, 733–735, 736, 737, 718, 719, 738, 714/710, 711
See application file for complete search history.

(56) References Cited

U.S. PATENT DOCUMENTS

| | | | |
|---|---|---|---|
| 5,291,496 A | 3/1994 | Andaleon et al. | |
| 5,896,329 A | 4/1999 | Trimberger | |
| 5,931,959 A | 8/1999 | Kwiat | |
| 6,526,559 B2 | 2/2003 | Schiefele et al. | |
| 6,530,049 B1 | 3/2003 | Abramovici et al. | |
| 6,851,082 B1 | 2/2005 | Corbett | |
| 6,862,692 B2 | 3/2005 | Ulrich et al. | |
| 6,871,295 B2 | 3/2005 | Ulrich et al. | |
| 6,973,608 B1 | 12/2005 | Abramovici et al. | |
| 7,111,215 B1 | 9/2006 | Keller et al. | |
| 7,114,109 B2 | 9/2006 | Daily et al. | |
| 7,134,104 B2 | 11/2006 | Goodnow et al. | |
| 7,139,928 B1 | 11/2006 | Bhattacharya et al. | |
| 7,155,711 B2 | 12/2006 | Vogel et al. | |
| 7,200,715 B2 | 4/2007 | Kleiman et al. | |
| 7,216,277 B1 * | 5/2007 | Ngai et al. | 714/733 |
| 7,250,786 B1 * | 7/2007 | Trimberger | 326/11 |
| 7,389,460 B1 * | 6/2008 | Demara | 714/733 |

(Continued)

OTHER PUBLICATIONS

B. Blodget et al., "A lightweight approach for embedded reconfiguration of FPGAs", Proceedings of the Design, Automation and Test in Europe Conference and Exhibition, IEEE Computer Society Reprint 1530-1591, 2003.

(Continued)

*Primary Examiner* — James H. Cho
*Assistant Examiner* — Christopher Lo
(74) *Attorney, Agent, or Firm* — AFMCLO/JAZ; Fredric L. Sinder

(57) ABSTRACT

A Field Programmable Gate Array (FPGA) circuit capable of operating through at least one fault. The FPGA circuit includes a configuration memory and an embedded microprocessor. The embedded microprocessor having access to the configuration memory, static modules, at least one relocatable module, and at least one spare module. The relocatable module being relocatable from a first target area to a second target area. The relocatable module being relocatable by manipulating a partial bitstream with the embedded microprocessor. The microprocessor calculating a plurality of bitstream changes, to relocate the at least one relocatable module using at least triple modular redundancy (TMR).

8 Claims, 2 Drawing Sheets

U.S. PATENT DOCUMENTS 7,415,644 B2 * 8/2008 Bower et al. .................. 714/724
7,590,885 B2 * 9/2009 Kondo et al. ................... 714/13
7,607,038 B2 * 10/2009 Barlow et al. ..................... 714/7

OTHER PUBLICATIONS

A. Weisensee et al., "A Self-Reconfigurable Computing Platform Hardware Architecture", Project Proteus, pp. 1-5.

A. Benso et al., "A Self-Repairing Execution Unit for Microprogrammed Processors", IEEE Reprint 0272-1732, Sep.-Oct. 2001.

J.M. Emmert et al., "Dynamic Fault Tolerance in FPGAs via Partial Reconfiguration", pp. 1-10.

J. Torreson, "Reconfigurable Logic Applied for Designing Adaptive Hardware Systems", pp. 1-5.

E. Carvalho et al., "Reconfiguration Control for Dynamically Reconfigurable Systems", DCIS 2004, pp. 405-410.

D. Mesquita et al., "Remote and Partial Reconfiguration of FPGAs: tools and trends", , Proceedings of the International Parallel and Distributed Processing Symposium, IEEE Computer Society Reprint 0-7695-1926, 2003.

* cited by examiner

| Function A | Function B | Function D | Function C | Unused |
|---|---|---|---|---|
| 21 | 22 | 23 | 24 | 25 |

| Function A | Function B | Unused | Function C | Function D |
|---|---|---|---|---|
| 21 | 22 | 23 | 24 | 25 |

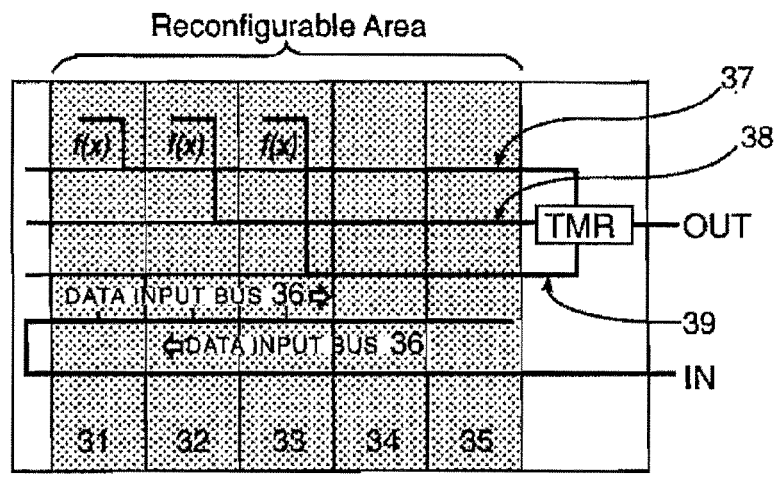
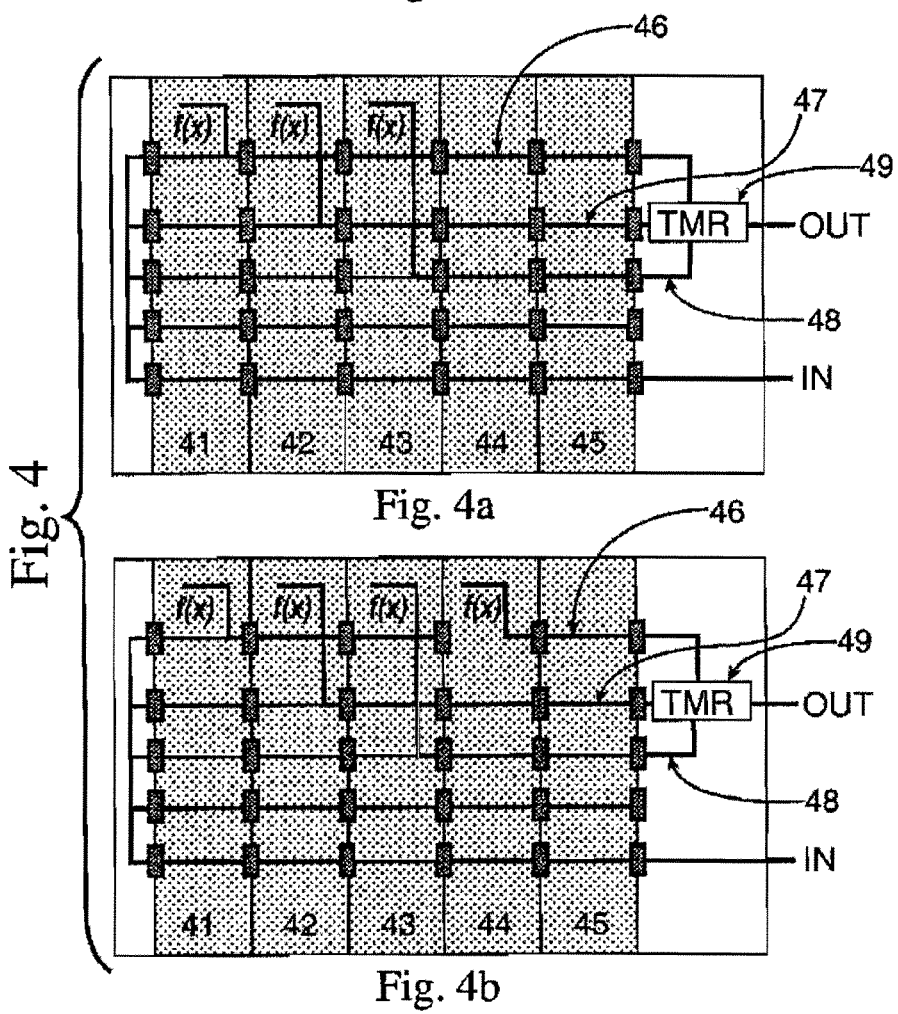

US 7,906,984 B1

RELOCATABLE FIELD PROGRAMMABLE GATE ARRAY BITSTREAMS FOR FAULT TOLERANCE

PRIORITY

This application claims priority from the USPTO provisional patent application entitled "Relocatable Field Programmable Gate Array Bitstreams for Fault Tolerance" filed on Feb. 26, 2008, Ser. No. 61/067,151 which is hereby incorporated herein by reference.

RIGHTS OF THE GOVERNMENT

The invention described herein may be manufactured and used by or for the Government of the United States for all governmental purposes without the payment of any royalty.

BACKGROUND OF THE INVENTION

The invention relates to an efficient fault recovery system that allows a Field Programmable Gate Array user circuit to operation through faults using triple modular redundancy (TMR). The bitstream translation program (BTP) provides passive redundancy and supports the replacement of modules without interrupting the correct operation of the user circuit. The BTP correctly translates partial bitstreams and can be implemented on an embedded microprocessor to perform internal partial reconfiguration.

The basic FPGA is an integrated circuit consisting of logic blocks, interconnects, and I/O blocks. Logic blocks can be individually configured to perform various functions and are connected using programmable interconnects. An FPGA configuration, including the function each logic block implements and its connections, is determined when the FPGA is programmed. This programmable architecture mean today's FPGAs can implement large and complex functions.

Field programmable gate arrays are digital integrated circuits that can be programmed and reprogrammed post-fabrication by a user to implement a custom circuit. FPGAs are not only a valuable tool for rapid prototyping and testing, but also for implementing actual production systems. The submicron scale of improved FPGAs increased the number of transistors on each device making them more powerful. As the transistor size has been reduced, the current density in the devices has increased making them more vulnerable to errors. Gamma particle radiation may cause errors in the state of a transistor. In order to use FPGAs in space systems, fault-tolerance techniques to improve the reliability and dependability of FPGAs are needed. Fault tolerance has traditionally been provided by building redundancy into a design. In FPGAs, designs may be hardened by replicating components and using techniques such as Triple Modular Redundancy.

Fault tolerant circuits continue to provide dependable results even if a fault occurs during operation. In an environment where multiple faults can be expected such as space applications, systems may be required to tolerate multiple faults before the system malfunctions.

U.S. Pat. No. 7,216,277 "Self-Repairing Redundancy for Memory Blocks in Programmable Logic Devices," Ngai et al. adds additional structure built into the FPGA to allow self-repair. The present invention alters bitstreams stored in memory to create a new bitstream which implement the faulty module in a new location to avoid the fault.

U.S. Pat. No. 6,973,608 "Fault Tolerant Operation of Field Programmable Gate Arrays," Abramovici et al. uses an external controller to perform partial reconfiguration, allowing for a more robust method if incremental reconfiguration which attempts to minimize the effects of the reconfiguration on the performance of the FPGA. The present invention uses internal partial reconfiguration, relying on the microprocessor within the FPGA to calculate a new bitstream and apply the internal configuration access port. In the present invention the column based layouts provide fault tolerance allowing for continued operation. Instead of using incremental changes, a layout that allows for large sections of the FPGA to be reconfigured without disrupting the performance of the user's circuit is used.

Unlike previous fault tolerance approaches, the approach below includes detection, diagnosis and repair. To prevent faults from propagating through the system TMR masks faults and reconfiguration replaces modules that have suffered an error.

SUMMARY OF THE INVENTION

A Field Programmable Gate Array (FPGA) circuit capable of operating through at least one fault. The FPGA circuit comprising a configuration memory and an embedded microprocessor. The embedded microprocessor having access to the configuration memory, static modules, at least one relocatable module, and at least one spare module. The relocatable module being relocatable from a first target area to a second target area. The relocatable module being relocatable by manipulating a partial bitstream with the embedded microprocessor. The microprocessor calculating a plurality of bitstream changes, to relocate the at least one relocatable module using at least triple modular redundancy (TMR).

The triple modular redundancy may optionally allow the relocatable module to be relocated while the FPGA circuit continues to operate. An optional bus system may allow modules to be relocated with partial column rerouting. The bus system may have only one route. The relocatable modules may be relocated to the second target area. The first target may be a relocatable module and the second target may be an area held by the spare module. Optionally, at least one relocatable module is relocated to the second target area by altering a portion of the bitstream.

BRIEF DESCRIPTION OF THE DRAWINGS

FIG. 3 is an illustration of a TMR circuit with three active functional modules and room for two spare modules.

FIG. 4a is an illustration of modular functions before reconfiguration.

FIG. 4b is an illustration of modular functions after reconfiguration.

DETAILED DESCRIPTION

Figures 1, 2, 2A, 2B:
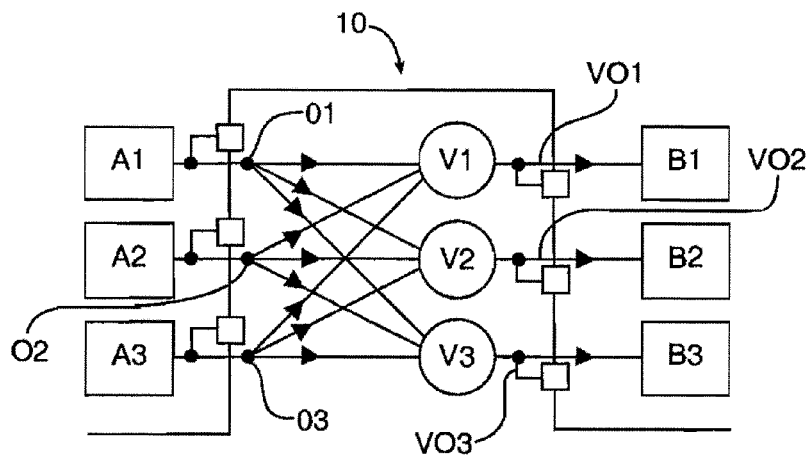
FIG. 1 is an illustration of a Triple Modular Redundant (TMR) circuit.
FIGS. 2a and 2b is an illustration FPGA column structure in an overlapping precompiled column scheme.

The invention includes a Field Programmable Gate Array (FPGA) capable of relocating reconfigurable modules with a bitstream translation program (BTP) which correctly changes the location of a partial bitstream that implements a module on the FPGA. This circuit can operate through a fault by efficiently removing the faulty module and replacing it with a relocated module without faults. The FPGA can recover from faults at a known location, without the need for external intervention using an embedded fault recovery system. The recovery system uses an internal PowerPC to relocate the modules and reprogram the FPGA.

To prevent faults from propagating through the system TMR masks faults and reconfiguration replaces modules that have suffered a hard error. In a traditional TMR circuit, it is difficult to determine which module is faulty since the TMR circuit masks the fault. To determine the faulty module a boundary scan configuration can be added to the TMR circuit 10 as shown in FIG. 1.

FIG. 1 includes three modules A1, A2 and A3, with outputs O1, O2, and O3 respectively. Voters V1, V2, V3 are digital circuitry integral to the TMR circuit 10 and provide a vote output VO1, VO2, and VO3 respectively. The respective vote outputs VO1-VO3 are provided to one or more boundary scan modules B1, B2 and B3 in FIG. 1.

The boundary scan (B1-B3) allows a microprocessor to analyze the output of each module (A1-A3) and the output of each of the voters (VO1-VO3). If one of the redundant modules has a different output, a fault is presumed to be causing the error. If all module outputs are equal but the voter outputs are not equal, the fault is presumed to be in the voters. Thus, the appropriate actions to take and how to repair of the circuit can be determined.

If the error is a soft error, it should automatically correct itself next time the registers within the module are updated. Since voters are normally implemented in combinational logic, this type of error will not affect the voters (V1-V3). If the error is not resolved after the registers have updated, there are two possible causes for the error. Either a soft error in the configuration memory has caused the behavior of the module (A1-A3) or voter (V1-V3) to change or a hard error has occurred within the module (A1-A3) or voter (V1-V3). If there is a soft error in configuration memory, it can be detected by extracting a partial bitstream from configuration memory and comparing it with the original bitstream or by checking the bitstreams CRC. If an error is detected, a partial bitstream can be reloaded to configuration memory, repairing the configuration memory. Once reconfiguration is complete, boundary scan can determine if reconfiguration was successful. If an error in the configuration memory is not detected, a probable cause of the error is a physical defect in the array. Physical defects in the array cannot be easily repaired and reconfiguration must remap the module to a fault free area of the FPGA. Although the TMR configuration has masked the module error from the rest of the FPGA, remapping the module restores the reliability index of the circuit.

A configuration bitstream does not contain bits to program any portion of a microprocessor. The configuration bitstream programs the configurable portion of the FPGA.

To maximize resources, once a portion of the FPGA is released by remapping the module (A1-A3) it contained, an embedded microprocessor can diagnose the released resources to determine exactly which resource is faulty. By keeping track of precisely which resources are defective, the microprocessor can maximize the use of the FPGA by allowing modules that do not use an affected resource to be mapped to that area. With TMR masking faults, there is some flexibility in the timing of detection, diagnosis and repair actions. Although there is overhead associated with each of these operations, the proposed built in self healing (BISH) system performs these operations as background tasks on the microprocessor, minimizing the circuitry dedicated to BISH.

Suitable embedded microprocessors may include the PowerPC, Xilinx MicroBlaze, or other microprocessors similar capabilities. Since the microprocessor is vulnerable to soft and hard errors, it is also implemented using TMR. Each microprocessor is broken up into small modules, and a malfunctioning microprocessor relies on the other two microprocessors to replicate the malfunctioning module, remove it from service and replace it. As with other proposed approaches, this approach has not been implemented and relies upon JBit-based tools for reconfiguration which are under development. Although this approach provides effective solutions for recovery from a number of different soft and hard errors, its developers acknowledge a number of vulnerabilities such as errors in the configurations control circuit, the ICAP and the boundary scan architecture. Protections other than reconfiguration must ensure that the reconfiguration system is available when needed. The embedded microprocessor may include static modules. Static modules are those that are not subject to relocation.

An alternative to pre-compiled tiles or dynamically generated configuration bitstreams may include reconfiguring the FPGA using bitstreams based on precompiled columns. This technique is typically has a faster reconfiguration time than other approaches since routing is not determined dynamically. The regular structure of Xilinx FPGAs, mean they have the same circuitry, routing resources, and configuration architecture in every CLB column which results in highly correlated bitstreams. Thus, multiple bitstreams can be compressed.

The function of the circuit is defined by the modules and their interconnections. FIGS. 2a and 2b show columns 21-25 in an overlapping precompiled column scheme for a configuration logic block (CLB) with functions A, B, C, and D. FIG. 2a shows a base configuration with column 5 intentionally unused. FIG. 2b illustrates an alternative configuration with column 3 intentionally unused. The unused columns in the base configuration for FIG. 2a leave room for alternative configurations which remap the modules. Since the structure of each configuration logic block (CLB) column is the same, groups of column-based modules can be shifted and the only additional reconfiguration needed is to repair the interconnections between groups. To reconfigure from the base configuration to alternative configuration in FIG. 2b, functions C and D are shifted to columns 4 and 5 and the interconnections between function B and function C were restored. Since functions C and D remain in adjacent columns, interconnections between the two column-based modules are intact. The number of unused CLB columns determines the fault tolerance of the FPGA. To tolerate m faults, m spare columns are required. If the base circuit configuration required k columns to implement the user function, the overlapping design required m+k CLB columns to map an m-tolerant configuration. To achieve a m column tolerant design, $C(k+m, m)=(k+m)!/(m!k!)$ configurations (including the base configuration) must be available or be calculated at runtime. However, since alternate configurations are generated by shifting the column-based modules, the bitstreams are similar and can be compressed and memory overhead reduced.

If the user circuit (the circuit being protected) can be implemented in less than ½ of the FPGA's columns, an alternative approach maps the entire user circuit into unused portions of the FPGA during reconfiguration. In one embodiment, the entire circuit is shifted into an unused portion. For a circuit to be m-column tolerant it must be mapped in 1/(m+1) or less of the entire FPGA columns. This approach uses less memory than the overlapping design because there are only m+1 configurations (including the base) and since the entire circuit is shifted as a block, the relative position among the column-based modules is preserved in all configurations. For both column-based module designs, circuit performance increases for the worst case critical path.

Currently no applications dynamically generate partial bitstreams within the FPGA. The techniques developed to date focus on efficient fault recovery and avoid dynamic generation of bitstreams due to the considerable time involve and large memory overhead of available tools.

An alternative to storing the partial bitstreams in memory is to retrieve the configuration data for a module from configuration memory. The retrieved configuration data may be translated and used to create a partial bitstream to relocate the module. This eliminates the need to store partial bitstreams but assumes that the configuration memory has not been corrupted and is not corrupting the process reading the configuration data.

Expanding on the column-based design, dual-FPGA reconfiguration architecture allows the system to recover from all types of soft errors. In the dual-FPGA configuration, each FPGA runs user applications and uses soft microcontrollers so each FPGA can be reconfigured. The microcontroller on each FPGA reprograms the other FPGA. User applications mapped on the FPGA must include error detection and autonomous recovery techniques to maintain proper operation. Once a non-recoverable error is detected and reported to the microcontroller, the microcontroller reports the error to the microcontroller on the other FPGA and the second FPGA reconfigures the first FPGA.

Since temporary errors are more common than permanent faults, a soft error is assumed and the second FPGA validates then corrects the configuration bits of the first FPGA if necessary. If an error persists once execution of the first FPGA is resumed, a permanent fault is presumed and the second FPGA reconfigures the first FPGA using a modified column-based pre-compiled reconfiguration scheme to avoid the fault. Since error detection is incorporated into the user circuit, the number of new configurations to be tried is reduced based on the location of the error detected.

The dual-FPGA approach also allows for an alternative to TMR which adds three microcontrollers to each FPGA (using considerable area). Instead, TMR concurrent error detection (CED) signals designed into the microcontrollers can determine if the other FPGA's microcontroller has an error and requires reconfiguration. This approach can be expanded to include the entire reconfiguration circuit making the dual-FPGA architecture capable of recovering for temporary or permanent errors to both the user circuit and the reconfiguration circuit. This approach relocates the core by manipulating the partial bitstream with an embedded microprocessor. Using this approach, only one partial bitstream for each module needs to be stored in memory, minimizing memory usage. To minimize the FPGA area dedicated to relocation, all calculations needed to manipulate the bitstream are performed using an embedded microprocessor. In an operational system the microprocessor could be used for other tasks when not needed for reprogramming.

To achieve user circuit operation through faults, the user circuit is implemented using TMR. Once the location of a fault is known, the microprocessor generates a partial bitstream by manipulating an existing partial bitstream stored in memory for the module determined to be faulty and relocating and reconnecting the module that replaces the faulty module. Three TMR configurations that take advantage of relocatable modules.

Relocatable modules are those portions of the circuit that are being protected by the present invention. They are created by making a copy of a good module and moving it to a reconfigurable region (functional part) in the FPGA. In one embodiment, a reconfigurable region is intended to be relocatable. Preferably the relocatable regions do not overlap with any embedded processor.

In one embodiment, relocatable modules recover from faults without storing individual bitstreams. Given the location of a fault in one of the relocatable modules, the system will automatically replace the faulty module by properly translating the bitstreams for the module and programming the FPGA through an internal configuration access port (ICAP).

Although bitstream relocation reduces the number of partial bitstreams needed, the configuration still requires three partial bitstreams to implement the entire functional module and one partial bitstream to program spare modules.

Relocatable modules greatly reduce the memory needed to store bitstreams. The module is relocated by altering its bitstream to change the target locations. Target locations are changed from a first target area that contains the faulty module to a second target area that will contain a relocated functioning module.

A column-based modular approach can be used to implement a fault-tolerant circuit that operates through faults. Partial bitstreams implement replacement modules in spare locations to repair the circuit when a fault is discovered. The reconfigurable modules that perform the primary function of the circuit are referred to as functional modules.

FIG. 3 is one illustration of a TMR circuit with three active functional modules and room for two spare modules. This TMR circuit contains three modules 31, 32, 33 that perform the same function $f(x)$. Their results are sent to a voting circuit, TMR, which determines the consensus output OUT. Modules 4 and 5 are spares which pass through the results. The input to each of the modules is delivered through a data input bus 36. Since the functional modules 31, 32, and 33 connect directly to the results buses 37, 38, and 39, this configuration is referred to as the direct connect design.

Using TMR provides two key benefits. First, TMR provides passive fault tolerance masking the fault and preventing errors from propagating into other parts of the system. Assuming only one module is faulty at a time and the two other modules continue to run correctly, the TMR circuit will select the output of the two correctly functioning circuits. Although translating the bitstream and reprogramming the FPGA takes time, the masking ability of the TMR circuit allows the circuit to continue to produce the correct result. The second benefit is the detection of errors. If two of the three modules are producing the same result, the module that does not match the other two must have an error and should be replaced. Although it is assumed that the location of the fault is know, a method similar to the boundary scan techniques could be used to determine the location of the fault. Once the module is replaced, redundancy is restored and system is ready for another fault.

Reconfiguring a circuit introduces two related problems, routing and timing. Once a module has been relocated it must be reconnected to the TMR circuit. Routing in the FPGA design is typically performed by implementation tools prior to programming the FPGA. In one embodiment, signals entering and exiting a reconfigurable area pass through bus macros. Thus an alternative solution for modular reconfiguration is needed.

One solution is to have multiple partial bitstreams which perform the same function but are connected to different busses. Each data bus used in the TMR design is labeled 37, 38, and 39 respectively in FIG. 3. Modules 31, 32 and 33 all perform the same function, represented by $f(x)$, but are connected to different busses. The busses carry the result from each module to the TMR circuit where their results are compared. This configuration eliminates the need for rerouting the design after reconfiguration. When using a TMR circuit, the results from each source must arrive within the same clock cycle. The three result busses carry the results from the functional modules to the TMR circuit. The data input bus in this configuration provides the same combined path length for the input and results signals no matter which location the function module is placed in. This ensures that timing is not affected by the location of the module. The input signal passes through each of the reconfigurable modules then loops back to the static module. The function implemented by the module receives input from the input bus as it passes through the modules the second time.

To implement a functional module on an FPGA, only one reference bitstream is needed. This bitstream can be altered to allow the module to be placed at any location on the FPGA. Column-based modules can be relocated using software to move them to any location on the FPGA.

FIG. 4a is an illustration of modular functions before reconfiguration. FIG. 4b is an illustration of modular functions after reconfiguration. Bus macros are shown between modules. FIG. 4a illustrates three modules 41, 42, and 43 have identical functionality but are connected to three different busses 46, 47, 48 feeding the TMR circuit 49. Modules 44 and 45 are spares but pass data. FIG. 4b shows an illustration where the bitstream used to program location 41 has been translated to program location 44, changing which module produces the result on bus 46 that reaches the TMR circuit 49.

Relocatable modules greatly reduce the memory needed to store bitstreams. The module is relocated by altering its bitstream to change the target location. This technique reduces the number of bitstreams needed to implement a module in n locations from n to 1. Comparing FIGS. 4a and 4b it can be seen that by moving module 41 into the location of module 44 not only is the functionality of module 41 replicated but it is also properly connected to the bus. This also prevents the faulty results of the module at location 41 from reaching the TMR circuit. Although storing and relocating multiple version of each functional module is a convenient way to reconnect modules in a dynamic partial reconfiguration system, the ability to place a module at multiple locations and connect to multiple busses increases the number of bitstreams needed. Without bitstream relocation, the number of bitstreams needed is: # of bitstreams=# of functions x# of locations x # of busses.

Although this technique allows a functional module to be placed in any location on the FPGA using only one bitstream, separate bitstreams to connect the module to different busses may be needed. With detailed knowledge of how the bitstream establishes connections between CLB blocks it is possible to establish new connections within the FPGA by manipulating the bitstream bit-by-bit. However, since the information required about how routes are connected in the FPGA is not readily available, techniques have been developed for dynamic routing which eliminate the needed for intricate knowledge of the FPGA and the need for separate versions of the functional module for each bus connection. The first is based on column-based partial reconfiguration and the second uses difference based partial reconfiguration.

To support dynamic routing, interconnect modules can be added to the partial reconfiguration area. By adding separate modules to perform bus routing, each functional module has a standard configuration. The output of each functional module is passed through the bus macro in the upper right corner of each functional module and the data on each of the busses passes through. The interconnect modules take the output of the functional modules and connect it to the appropriate bus while allowing the data on the other busses to pass through unchanged. Note that this configuration can easily be expanded by adding additional busses. Similar to the partial bitstream used to instantiate the functional modules, the bitstreams for reference interconnect modules can be altered to change where the module will be placed. Using interconnect modules, reconfiguring the circuit consists of relocating the functional module followed by relocating the interconnect module that connects it to the proper result bus.

FIG. 5 is an illustration of Relocatable Functional and Interconnect Module Configuration. Using interconnect modules IM allows the all functional modules 51, 52, 53, 54, and 55 to have a standard configuration by eliminating the need for different versions that connect to the different result busses. Interconnect modules for dynamic routing is # of bitstreams=# of functions+# of busses. Only one partial bitstream is needed for each functional module and each interconnect module since they can be relocated to the desired location.

The other form of partial reconfiguration is difference-based partial reconfiguration. When there are small changes between two designs, a partial bitstream can be produced that only reflects the changes between the two designs. Difference based partial reconfiguration creates a partial bitstream by comparing two bitstreams and determining which frames are different between them. The partial bitstream only reprograms the frames that have changed.

Relocatable Modules may be combined to function with look up tables through the bus connections. To prevent large differences between the bitstreams for functional modules that connect to different busses, a multiplexer selects which bus each functional module places its output on. The bus selected by the multiplexer is determined by the value of the look up tables (LUTs). To change which bus the module is connected to, the values in the LUTs are changed using partial reconfiguration. To ensure that the only difference between functional modules that connect to different busses is the change in the LUTs, the modules that connect to different bitstreams are created by editing the Native Circuit Description (NCD) file for the functional module. The NCD file contains a physical representation of the design mapped to specific resources in the target FPGA. The modified NCD file of the functional module in location 1 that connects to results bus 1 results in a functional module that passes through all signals. From these two NCD files, a difference-based partial bitstream is generated which changed the values in the LUTs. Unlike the previous two approaches, LUT-based routing requires special care to prevent the relocated module from connecting to the wrong results bus. To prevent result bus contamination, the initial configuration of the relocatable functional modular must pass signals on the result busses unaltered. Once the functional module has been placed, the partial bitstream to change the values in the LUTs, selecting the proper results bus, can be relocated and applied.

One example of software to accomplish the present invention for partial bitstream routing is attached as a text file.

While specific embodiments have been described in detail in the foregoing description and illustrated in the drawings, those with ordinary skill in the art may appreciate that various modifications to the details provided could be developed in light of the overall teachings of the disclosure.

What is claimed is:

1. A FPGA circuit capable of operating through at least one fault, the FPGA circuit comprising:
   a configuration memory;
   an embedded microprocessor with access to the configuration memory, static modules, at least one relocatable module, and at least one spare module, the relocatable module being relocatable from a first target area to a second target area;

the relocatable module is relocatable by manipulating a partial bitstream with the embedded microprocessor, the microprocessor calculating a plurality of bitstream changes, the plurality of bitstream changes used to relocate the at least one relocatable module using at least triple modular redundancy from the first target area to the second target area.

2. The FPGA circuit of claim 1 wherein the triple modular redundancy allowing the relocatable module to be relocated while the FPGA circuit continues to operate.

3. The FPGA circuit of claim 1 further comprising a bus system that allows modules to be relocated with partial column rerouting.

4. The FPGA circuit of claim 1 further comprising a bus system with only one route.

5. The FPGA circuit of claim 1 wherein the modules are relocated to the second target area.

6. The FPGA circuit of claim 1 wherein the first target is a relocatable module and the second target is an area held by the spare module.

7. The FPGA of claim 1 wherein at least one relocatable module is relocated to the second target area by altering a portion of the bitstream.

8. The FPGA of claim 1 wherein the TMR includes three voters.

* * * * *